United States Patent [19]

Spahn

[11] Patent Number: 5,118,372
[45] Date of Patent: Jun. 2, 1992

[54] METHOD OF FORMING A PROTECTIVE AND DECORATIVE SHEET MATERIAL ON A SUBSTRATE

[75] Inventor: Robert G. Spahn, Webster, N.Y.

[73] Assignee: Eastman Kodak Company, Rochester, N.Y.

[21] Appl. No.: 617,458

[22] Filed: Nov. 21, 1990

Related U.S. Application Data

[63] Continuation of Ser. No. 274,214, Nov. 21, 1988, abandoned.

[51] Int. Cl.⁵ .............. B21B 1/24; B29C 51/02; B29C 51/04; B29C 51/14
[52] U.S. Cl. .................. 156/160; 156/183; 156/245; 156/285; 29/527.2; 264/134; 264/292; 264/510; 427/257; 427/258; 427/264; 427/304
[58] Field of Search .......... 264/510, 512, 134, 292; 156/160, 163, 233, 245, 285, 183, 184; 427/257, 258, 261, 264, 262, 267, 304, 305, 306; 29/527.2

[56] References Cited

U.S. PATENT DOCUMENTS

| | | | |
|---|---|---|---|
| 2,681,294 | 6/1954 | Beguin | 430/538 |
| 3,082,510 | 3/1963 | Kelly et al. | 427/257 |
| 3,539,374 | 11/1970 | Isaacson | 264/134 |
| 3,962,397 | 6/1976 | Narui et al. | 264/144 |
| 4,115,619 | 9/1978 | Kurfman et al. | 428/336 |
| 4,116,892 | 9/1978 | Schwarz | 264/154 |
| 4,246,381 | 1/1981 | Robeson | 525/444 |
| 4,287,325 | 9/8198 | Jackson, Jr. et al. | 525/444 |
| 4,407,871 | 10/1983 | Eisfeller | 428/148 X |
| 4,431,711 | 2/1984 | Eisfeller | 428/148 X |
| 4,459,772 | 7/1984 | Kanzelberger | 156/219 X |
| 4,582,876 | 4/1986 | Weemes et al. | 525/64 |
| 4,643,789 | 2/1987 | Parker et al. | 264/510 |
| 4,681,811 | 7/1987 | Simpson et al. | 427/407.1 X |
| 4,726,982 | 2/1988 | Traynor et al. | 428/213 |
| 4,769,100 | 9/1988 | Short et al. | 156/285 |
| 4,904,748 | 2/1990 | Seymour et al. | 525/444 |
| 4,918,800 | 4/1990 | Reafler | 29/527.2 |
| 4,960,558 | 10/1990 | Short | 264/510 |
| 4,976,896 | 12/1990 | Short et al. | 264/134 |

FOREIGN PATENT DOCUMENTS 1051168 12/1966 United Kingdom .............. 264/512

Primary Examiner—Jan H. Silbaugh
Assistant Examiner—Catherine Timm

[57] ABSTRACT

In the manufacture of a decorative sheet material to be bonded to a substrate to provide a surface having a brushed metal appearance, a light-reflective, glossy metal layer is formed on a thermoformable carrier film. A pattern of straight and parallel microscopic cracks is created in the metal layer at a temperature below Tg of the carrier film by bi-directionally bending and drawing the resulting sheet material around a straight cracking member. Thereafter, the sheet material is stretched at a temperature above Tg of the carrier film. This creates an attractive brushed metal appearance of reduced gloss.

5 Claims, 3 Drawing Sheets

METHOD OF FORMING A PROTECTIVE AND DECORATIVE SHEET MATERIAL ON A SUBSTRATE

This is a continuation of application Ser. No. 274,214, filed Nov. 21, 1988, now abandoned.

FIELD OF THE INVENTION

This invention relates to protective and decorative sheet materials, and more particularly to protective and decorative sheet materials which are capable, upon being applied to a substrate, of exhibiting a "brushed metal" appearance. It also relates to a method of making such protective and decorative sheet materials, and to articles coated therewith.

BACKGROUND OF THE INVENTION

It is well known that decorative films can be provided which comprise a thermoplastic carrier film coated with a metallic layer. For example, Kurfman et al. in U.S. Pat. No. 4,115,619, issued Sep. 19, 1978, describe thermoplastic carrier films which have coated thereon a normally solid soft metal such as indium or an alloy of tin and cadmium, and which can be stretched and elongated without losing the initial specular reflectivity of the metal coating. Such materials are useful, for instance, in covering automobile parts, appliances or other substrates. However, for some applications, it is desirable to provide decorative metal surfaces which have a brushed metal appearance, i.e., a relatively non-specular surface, rather than a highly specular surface.

BRIEF SUMMARY OF THE INVENTION

In accordance with this invention, it has been found, most unexpectedly, that certain metal-coated carrier films, upon being stretched and thermoformed onto a substrate, provide an attractive brushed metal appearance.

In accordance with one embodiment of this invention, a protective and decorative sheet material comprises a thermoformable carrier film which has a metal layer thereon having a 20-degree gloss of at least 100, the metal layer having a pattern of microscopic cracks; and, the metal layer being capable when the sheet material is stretched at a temperature above the glass transition temperature of the carrier film, of exhibiting a brushed metal appearance having a 20-degree gloss of less than 100.

In accordance with another embodiment of this invention, a method is provided for forming a protective and decorative sheet material, capable of being bonded to a substrate, which comprises:

A) forming a highly reflective, specular, continuous metal layer on a stretchable, thermoformable carrier film; and thereafter, B) creating a pattern of microscopic cracks in the metal layer at a temperature below the glass transition temperature of the carrier film without substantially stretching the carrier film, the metal layer being capable, when the sheet material is stretched at a temperature above the glass transition temperature of the carrier film, of exhibiting a brushed metal appearance and a 20-degree gloss of less than 100.

In still another embodiment of this invention, a method of forming a protective and decorative sheet material on a substrate comprises:

A) forming a continuous metal layer on a stretchable, thermoformable carrier film, the metal layer having a 20-degree gloss of at least 100;

B) creating a plurality of microscopic cracks in the metal layer at a temperature below the glass transition temperature of the carrier film without substantially changing the gloss of the metal layer, by bi-directionally bending and drawing the film around a cracking member; and, thereafter C) stretching the film at a temperature above the glass transition temperature of the carrier film, and bonding the film to a substrate, said stretching enlarging the cracks in the metal layer to create a brushed metal appearance and reduce the 20-degree gloss of the metal layer to less than about 100.

In a further embodiment of this invention, there is provided an article having thereon a protective and decorative sheet material of the type described above.

In the embodiments described above, the pattern of microscopic cracks is created at a temperature below the glass transition temperature (Tg) of the carrier film, and the sheet material thus obtained is stretched at a temperature above the glass transition temperature of the carrier film and bonded to a substrate.

Although thermoforming is a preferred method of stretching the film after the metal layer is formed and cracked, it is also possible to create the brushed metal appearance by stretching the film (preferably at least bi-directionally) in other ways, e.g., by drafting and/or tentering the film at a temperature above the glass transition temperature of the carrier film. In this case, the film need not be thermoformed but can be bonded to a surface without further substantial stretching.

The sheet material can be applied to a three-dimensional substrate by thermoforming with vacuum. The material is softened by heating, e.g., with banks of infrared lamps or with ceramic heaters to a typical temperature of 115°-150° C., and plastically stretched during thermoforming to conform to the shape of the substrate. Portions of the sheet material may be stretched to an area which is up to 100% or even 150% greater than its relaxed area. The material is thus brought into conforming association with at least one surface of the substrate and is securely bonded to the substrate to form thereon a smooth and wrinkle-free protective and decorative coating exhibiting a non-specular brushed metal appearance.

In another embodiment, this invention provides a method of molding a shaped article and simultaneously providing such article with a protective and decorative coating of the type described herein. The method comprises the steps of (1) positioning the sheet material having a microscopically cracked metal layer over the molding surface of a mold, the cracked metal layer being between the surface of the mold and the carrier film; (2) injecting into the mold a fluid composition which is capable of hardening to both form the desired shaped article and bond to the carrier film; and (3) removing from the mold a shaped article having the sheet material bonded thereto. For example, the sheet material can be integrally bonded to a molded elastomeric article. In this instance, the material is placed in a mold cavity, and an elastomeric molding compound, such as a urethane rubber, is injected into the mold cavity under pressure against the side of the carrier film opposite the light-reflecting metal layer to stretch the film so it conforms to the shape of the molded article formed by injecting moldable material into the cavity of the mold and bonds to the outer surface of the article. Suitable molds, hardenable fluid compositions and molding process parameters for this method are well-known and form no part of the present invention.

BRIEF DESCRIPTION OF THE DRAWINGS

This invention is further illustrated in the following detailed description and in drawings in which.

DESCRIPTION OF THE PREFERRED EMBODIMENTS

Figure 1:
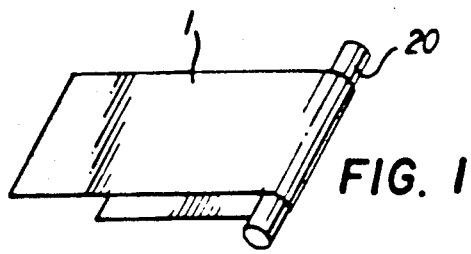
FIGS. 1 and 2 show a method of creating microscopic cracks in a metal layer on a flexible carrier film.

The flexible and stretchable carrier film employed in accordance with this invention advantageously comprises an essentially planar, self-supporting, stretchable thermoplastic polymeric film. Suitable polymeric materials for the flexible and stretchable carrier film include thermoplastic polymers having heat softening and tensile elongation properties which are suitable for thermoforming or vacuum forming processes. The flexible and stretchable carrier film can be transparent, translucent or opaque. The carrier film has a substantially uniform thickness. Preferably, the carrier film has a mean thickness Ts in the range of from about 0.16 to 0.32 millimeters. The thickness uniformity of the carrier film contributes to the uniformly attractive appearance of the protective and decorative sheet materials of this invention.

Suitable materials for the carrier film include stretchable thermoplastic polymeric films having heat softening and tensile elongation properties which adapt it to use in the thermoforming process. Preferred materials are those known to be useful in thermoforming and/or vacuum-forming techniques, such as polyvinyl chloride, polyvinyl acetate, ABS (acrylonitrile-butadiene-styrene) resins, polyethylene and polypropylene. Useful carrier film materials include the polyacrylate blends with copolyesters described in U.S. Pat. No. 4,246,381, and the copolyesters derived from aromatic polyesters and glycol polyesters described in U.S. Pat. No. 4,287,325. Blends of rubber-modified styrene-maleic anhydrides with polycarbonates and/or polyesters are also useful, as are blends of poly(ether-esters) and polyesters. Particularly preferred carrier film materials exhibit a tensile elongation at break of at least about 40 percent when measured in accordance with ASTM D-638. A highly preferred carrier film material is a blend of copolyesters based on poly(1,4-cyclohexylenedimethylene terephthalate) and rubber-modified styrene-maleic anhydride copolymers as described in U.S. Pat. No. 4,582,876. Other preferred compositions for the carrier film include the blend of poly(ether-esters) and polyesters disclosed in Seymour, U.S. patent application Ser. No. 151,727 filed Feb. 3, 1988, now U.S. Pat. No. 4,904,748. The carrier film can include fillers, UV absorbers, plasticizers, colorants, antioxidants, etc. known to be useful in polymeric films.

In accordance with the invention, a continuous metal layer is applied over the above-described thermoformable carrier film. The metal layer can be deposited on the carrier film. Alternatively, the metal layer can be deposited on an intermediate layer, such as a paint layer or an adhesion promoting layer, disposed on the carrier film. Such metal layer can be applied by vacuum deposition, electrolytic or electroless deposition or similar known metallizing techniques.

One preferred method for applying the continuous metal layer to the carrier film is the electroless process described by Lowenheim in "Metal Coatings of Plastics," Noyes Date Corporation, (1970), by Pinter, S. H. et al., "Plastics: Surface and Finish," Daniel Davey & Company, Inc., 172-186 (1971), or in U.S. Pat. No. 2,464,143. An especially preferred metallization technique useful in the practice of this invention is a vacuum deposition technique wherein the metal is vacuum evaporated onto the polymer layer as described by William Goldie in "Metallic Coating of Plastics," Vol. 1, Electrochemical Publications Limited, Chap. 12 (1968). Other preferred metallization techniques include the sputter coating procedure described in Chapter 13 of Goldie, supra, and the deposition method disclosed in U.S. Pat. No. 3,197,175. Other suitable metallization techniques include electroplating and ion plating. The vacuum deposition of the metal layer may also be carried out by the techniques described by Maissel & Glang, in the "Handbook of Thin Film Technology," or by Vossen and Kern, in "Thin Film Processes."

For metallizing large areas (or quantities), the carrier film can be coated in web form in a batch web coater or in an air-to-air, in-line vacuum web coater. For highest production rates, an evaporation process is preferred; for some materials and effects, sputtering may be desirable.

Any metal can be employed in the practice of this invention which is sufficiently brittle that microscopic cracks are formed therein when "pre-cracked" in accordance with the procedure described below. Titanium is the presently preferred metal, although other microscopically crackable metals, such as silver, chromium, nickel, iron and various alloys can also be employed.

The metal layers employed in this invention are generally from 0.02 to 1.0 μm in thickness, and preferably have a thickness of from 0.04 to 0.15 μm.

The surface reflectivity of the metal layers employed herein can be quantified by two measurements of different surface characteristics: gloss and geometric metamerism (also called flop).

The total light reflected from the metal surface includes light reflected at a specular angle and the remaining light which is scattered at non-specular angles. The specularly reflected light is a measure of gloss. Rough surfaces and matte surfaces tend to scatter the light and exhibit low gloss. Conventional gloss indices measure the light reflected through a small aperture at the specular angle (e.g., 20 degrees) and are calibrated to a standard index. For the purpose of providing a reference, a highly reflective surface exhibits a 20-degree gloss in excess of 100 when measured on a Hunterlab Model D47R-6 Dorigon Glossmeter in accordance with ASTM Test D-2457.

Geometric metamerism (flop) is a term used to describe the degree of metallic appearance of metallic paints. A high flop is a high degree of metallic appearance. It is characterized by a high level of reflection intensity in the angles adjacent to the specular angle (usually much higher intensities than would be achieved by a non-metal) and a very low intensity at far (flop) angles. Geometric metamerism can be determined by the method disclosed in Alman U.S. Pat. No. 4,479,718, titled "Three Direction Measurements for Characterization of a Surface Containing Metallic Particles".

Figure 3:
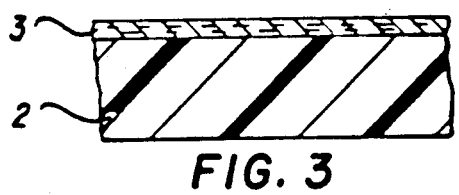
FIGS. 3-7 show cross-sections, not to scale, of various protective and decorative sheet materials in accordance with the invention.

In accordance with this invention, a flexible and thermoformable carrier film having a highly reflective, specular, continuous metal layer thereon is subjected to a "pre-cracking" operation. Pre-cracking forms, in the metal layer, a pattern of microscopic cracks. Pre-cracking preferably is conducted by applying tension to the metal layer. Tensile pre-cracking has been found to produce more uniform microscopic cracks than pre-cracking using compressive techniques. One presently preferred form of pre-cracking is shown in FIG. 1 wherein a flexible sheet material of the type described herein comprising a carrier film 2 and having deposited thereon a metal layer 3 (as shown in FIG. 3) is drawn and bent, under tension, around cracking member 20. The latter, in the embodiment shown in FIG. 1, is a small-diameter rod or mandrel which advantageously has a diameter of up to about 0.5 centimeter and preferably a diameter of approximately 0.3 centimeter. Sheet material 1 is wrapped approximately 180 degrees around cracking member 20 to form microscopic cracks in the metallic layer. The pre-cracking step results in the formation of substantially straight and parallel microscopic cracks in the metal layer, in a direction perpendicular to the direction of travel of sheet material 1. A generally rectangular or quadrangular pattern of microscopic cracks is formed when in a second step the sheet material is pulled around cracking members 20 in a direction perpendicular to the path of travel of the first cracking operation. Differently shaped microscopic crack patterns, such as trapezoidal or generally triangular shaped patterns can be formed when the angular paths of travel of the sheet material are chosen to be non-perpendicular with respect to each other.

Figure 2:
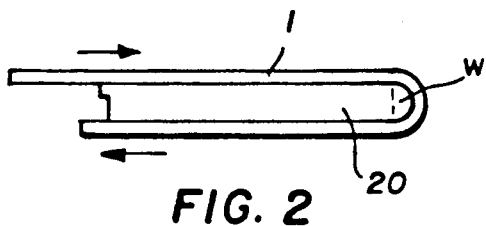

Although cracking member 20 is depicted in FIG. 1 as a cylindrically shaped rod or mandrel, the cracking member can have other configurations so long as it provides a relatively thin edge or wrap portion for bending and cracking the metal layer. If desired, the cracking member can have an essentially planar configuration terminating in a wrap portion or edge w as cross-sectionally shown in FIG. 2. The surface of the edge w in FIG. 2 is advantageously made of a material which reduces the friction between the sheet material and the cracking member during the bending and cracking operation. To further reduce friction, the cracking member or edge w can be a rotating rod of small diameter.

The cracked metal layer becomes translucent in proportion to the degree of stretching which the sheet material undergoes during the thermoforming operation. The so-created translucency produces desirable visual effects as, for example, the color of an underlying paint layer is diffusely visible after bonding of the sheet material to a substrate.

The decorative sheet material in accordance with this invention can comprise several different arrangments. FIG. 3 illustrates a sheet material comprising a flexible and stretchable carrier film 2 having a metallic layer 3 thereover.

Figure 4:
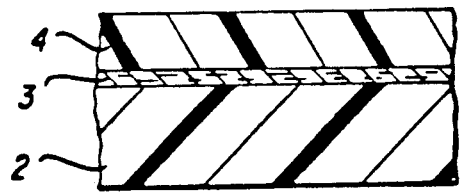

In FIG. 4 there is shown flexible and stretchable carrier film 2 having metallic layer 3 thereon and clear coat 4 thereover.

Figure 5:
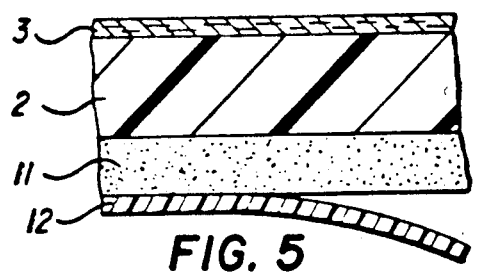

In FIG. 5 a flexible and stretchable carrier film 2 has a metallic layer 3 thereon and, on the reverse side, an adhesive layer 11 with a protective sheet 12 releasably adhered to adhesive layer 11.

Figure 6:
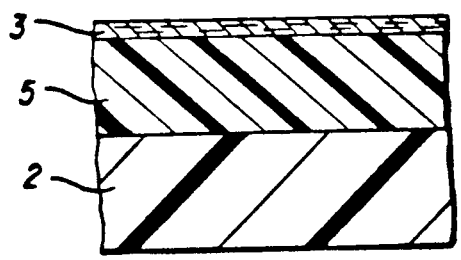

FIG. 6 shows an embodiment in which the metallic layer 3 is deposited on a paint layer 5 which has been coated and dried on the carrier film 2.

Figure 7:
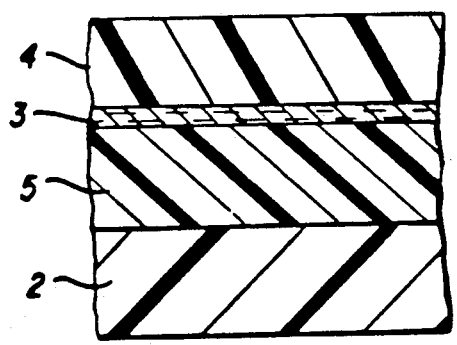

In FIG. 7, the sheet material of FIG. 6 is depicted with clear coat 4 thereon.

Paint layers useful herein preferably comprise a colorant incorporated in a film forming binder. Conventional colorants used in surface coating compositions can be employed, including inorganic pigments such as titanium dioxide, iron oxide, chromium oxide, lead chromate, carbon black, silica, talc, china clay, metallic oxides, silicates, chromates, etc., and organic pigments, such as phthalocyanine blue, phthalocyanine green, carbazole violet, anthrapyrimidine yellow, flavanthrone yellow, isoindoline yellow, indanthrone blue, quinacridone violet, perylene reds, diazo red and others known to those skilled in the art.

The paint layer can include reflective particles in addition to a colorant and binder. Any particles conventionally employed in paints, particularly those employed in automotive finish paints can be used. Suitable reflective particles include metallic flakes such as aluminum flake, copper flake, bronze flake, copper bronze flake, nickel flake, zinc flake, magnesium flake, silver flake, gold flake, platinum flake and other platelets such as mica, glass, stainless steel, coated mica, coated glass, and aluminum coated polyester film fragments. Mixtures of two or more types of particles can be used.

The film-forming binder can comprise any of the film-forming resins conventionally used as binders in base coat compositions. Particularly useful resinous binders are acrylic polymers, polyesters, including alkyds, and polyurethanes. Examples of such binders and methods for the preparation thereof are described in U.S. Pat. Nos. 4,681,811; 4,403,003 and 4,220,679. A preferred resin binder for the paint layer comprises a polyurethane which can be prepared by reacting polyester polyols or acrylic polyols with a polyisocyanate. The paint composition generally is applied to the support film in a liquid medium.

The paint layer, adhesive layer and clearcoat layer can be applied by forming a laminar flow of the coating composition, and directing the flow into contact with the surface of the support to form the layer, as further described in Reafler patent application U.S. Ser. No. 116,426 filed Nov. 3, 1987.

The paint layer may be coated on the carrier film having thereon an adhesion promoting tie-layer. Suitable tie-layers can be formed from compositions comprising an adhesion promoting species and optionally a suitable solvent. Useful adhesion promoting species include polymers derived from acrylonitrile, vinylidene chloride, and acrylic acid; polymers derived from methylacrylate, vinylidene chloride and itaconic acid; cellulose nitrate, and a variety of commercially available adhesion promoting species, for example, those known under the trade designations FORMVAR 7/95, FORMVAR 15/95, BUTVAR B-98 and BUTVAR B-72, sold by Monsanto, MOBAY N-50 sold by Mobay, VINAC B-15 sold by Air Products, ELVACITE sold by DuPont, and LEXAN sold by General Electric. Suitable solvents include methyl ethyl ketone, methylene chloride, tetrahydrofuran, toluene, methyl cellosolve, methanol, ethanol, propanol, butanol, mixtures thereof and the like. The adhesion promoting layer preferably has a thickness not greater than about 0.0025 millimeter.

In certain embodiments of the invention, it is desirable to employ a clear top coating. Suitable clear coats are transparent and can comprise crosslinkable polyols such as polyester polyols, polyurethane polyols and acrylic polyols, and polyisocyanate curing agents. The clear layer composition can be sprayed or extruded through the narrow slot of a precision coating hopper (as in U.S. Pat. No. 2,681,294) onto the metal layer of the sheet material. This latter method advantageously results in improved smoothness, compared to top coats applied by conventional spraying techniques. The clear layer is then converted to a dry and tack-free state, for example by drying by conventional drying techniques at temperatures of 25°–100° C. The clear coat can be applied before or after the pre-cracking step. When applied before pre-cracking, the clear coat should be selected from compositions which do not interfere with the pre-cracking step or with the stretching step which converts the appearance of the metal coating to one having a 20-degree gloss less than 100. Clear coats, whether applied before or after pre-cracking, can change the gloss measurements. Consequently, the measurements given herein refer to the metallic coatings without clear coats.

An important functional requirement of the new type of decorative sheet material of this invention is that it be securely attachable to a shaped substrate. In one form, the sheet material is made soft and flowable by application of heat and is then brought into contact with the article to be coated and securely bonded thereto. Such bonding can be effected by known adhesive bonding techniques, using a wide variety of suitable adhesive compositions, including pressure sensitive and heat activated adhesives, coated on the side of the carrier film opposite to the deposited metal layer.

The adhesive layer preferably comprises a pressure sensitive adhesive. Preferred adhesives of this type are the acrylic adhesives. Examples of such adhesives include the acrylic copolymers of a higher alkyl acrylate such as 2-ethylhexyl acrylate copolymerized with a polar comonomer such as acrylic acid, acrylamide or maleic anhydride. The adhesive is coated from a solution of water or an organic solvent which can also contain additives such as a tackifier resin. Further examples of useful acrylic pressure sensitive adhesives are described in Traynor et al. U.S. Pat. No. 4,726,982 issued Feb. 23, 1988. Such adhesive layers are preferably applied to the flexible and stretchable film by a laminar flow coating method as described in Reafler U.S. patent application Ser. No. 116,426 filed Nov. 3, 1987.

The adhesive layer, if present, is coated onto the carrier film of the sheet material after completion of the pre-cracking operation as described hereinabove.

Following application of a pressure sensitive adhesive layer, a protective release sheet is applied to the adhesive material to permit handling of the sheet material prior to its use. The release sheet is preferably a thin polyester film having a thickness of about 0.04 mm.

The following examples further illustrate the invention:

EXAMPLE 1

A carrier film was prepared from a blend described in U.S. Pat. No. 4,582,876 as follows. A mixture of 55:45 percent by weight of polyester 1) and Dylark ® Styrene Copolymer 600 was compounded by extrusion. Polyester 1) was derived from terephthalic acid, 19 mole percent ethylene glycol and 81 mole percent 1,4-cyclohexanedimethanol. Dylark ® Styrene Copolymer 600 is a rubber modified stryrene-maleic anhydride copolymer available from ARCO Chemical Company, a division of Atlantic Richfield Company. The blend was heated to 200°–290° C. and extruded through a die into a nip comprising two temperature controlled chrome plated stainless steel rollers. The extruded web was then cooled on a chill roller. The thermoplastic carrier film had a mean thickness of about 0.20 millimeters and a glass transition temperature (Tg) of 93° C. Onto one surface of the carrier film prepared as described above was applied a layer of titanium at a thickness of about 0.1 μm by the vacuum deposition process described by Maissel and Glang in Sections 1-50 and 1-54 of the Handbook of Thin Film Technology, (1983 Edition) published by McGraw-Hill Book Company, New York. The 20-degree gloss of the surface of the metal layer measured by the aforementioned method was in excess of 100. A 12×26 cm sheet of the so-prepared sheet material was pre-cracked at a temperature of 22° C. by manually pulling the sheet sequentially in two directions perpendicular with respect to each other firmly over a smooth metal rod of 5 mm diameter at a wrap angle of 180°, with the surface of the carrier film remote from the metal layer making contact with the rod. The 20-degree gloss of the metal surface of the pre-cracked sheet was measured again and found to be still in excess of 100. The sheet material obtained was then molded into a cylindrically shaped configuration by a vacuum thermoforming process as follows: The sheet was heated by banks of infra-red lamps to about 135° C., then moved to an opening of a chamber containing a cylindrical substrate and releasably applied by vacuum drawdown. The now cylinder-shaped sheet material was removed from the substrate and had a diffuse, non-specular surface having a brushed metal appearance distinctly different from that of the glossy surface of the sheet prior to the thermoforming step. The 20-degree gloss of a portion of the metal surface having been stretched during the thermoforming operation by about 70% was found to be about 60. Stretched portions of the sheet material were translucent.

The surface of the same portion having been stretched by about 70% exhibited a geometric metamerism (flop) of 114 as measured by the method disclosed in U.S. Pat. No. 4,479,718, and calculated by the Alman Equation:

$$\text{Flop} = 15(L_1^* - L_3^*)^{1.11}/L_2^{*0.86}$$

wherein $L_1^*$, $L_2^*$ and $L_3^*$ are the lightness values measured at 15°, 45° and 110° intervals away from the specular refection angle.

The reading was made with a Murakami Goniospectrophotometer at the reflection angles:

$L_1^* = 30°$ $L_2^* = 0°$ $L_3^* = -65°$ using a CIELAB value with D65 illumination and a 10° viewer at the above defined $L_1^*$, $L_2^*$, $L_3^*$ reflection angles and a 45° incidence angle.

Figure 8:
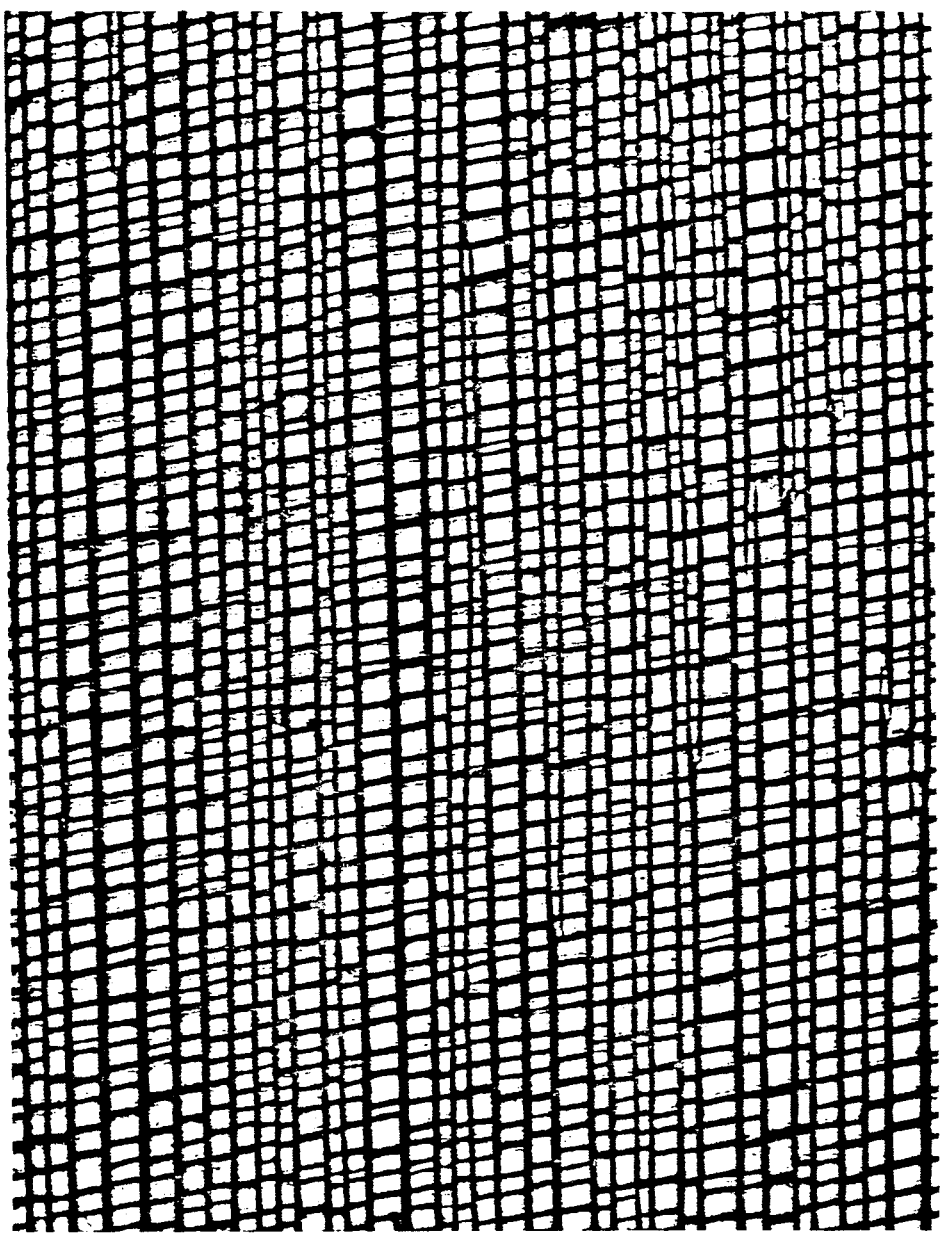
FIG. 8 is a 70× enlarged photograph of a crack pattern in the metal layer of a protective and decorative sheet material of the invention after stretching and thermoforming.

FIG. 8 is a 70× enlarged photograph showing an approximately quadrangular microscopic crack pattern in the metallic layer of the protective and decorative sheet material after it has been stretched and thermoformed as described above.

EXAMPLE 2

The procedure of Example 1 was repeated except that between the pre-cracking and the thermoforming steps the vapor deposited metal layer was overcoated with a clear top coat at a dry thickness of about 0.03 mm. The clear top coat was prepared from a crosslinkable polyurethane film-forming composition comprising a polyurethane polyol as one component and a polyisocyanate as the other, as disclosed in the patent to Porter, U.S. Pat. No. 4,719,132.

The composition of the two components were as follows:

| | Approx. % Weight |
|---|---|
| Component A | |
| Urethane Resin | 60 |
| Toluene | 30 |
| Benzotriazole (diluted to 58% solids with toluene) | 1 |
| Component B | |
| Polyfunctional aliphatic isocyanurate resin based on 1,6 hexamethylene diisocyanate (diluted to 85% solids with toluene) | 100 |

Components A and B were mixed immediately prior to the coating operation.

Results similar to those described in Example 1 were obtained.

EXAMPLE 3

Similar results were obtained with a sheet material as described in Example 2 wherein prior to the metal deposition step the carrier film was overcoated with an adhesion promoting layer of the composition described below:

| Ingredients | Approx. % Wt. |
|---|---|
| Ethylene Glycol Monohexyl Ether | <1 |
| Deionized Water | 75 |
| N,N-Dimethyl Ethanolamine | <1 |
| N-Methylpyrrolidone | 1 |
| Diethylene Glycol Monobutyl Ether | 1 |
| Acrylic Resin (1) | 10 |
| Urethane Resin (2) | 10 |
| diluted with water to a total solids content of 8.6% by weight. | |

(1) Styrene-butyl acrylate-butyl methacrylate terpolymer
(2) Reaction product of methylene dicyclohexyl diisocyanate and an aliphatic diol Upon drying, the above described layer had a thickness of about 0.0005 mm.

COMPARISON EXAMPLE 1

Figure 9:
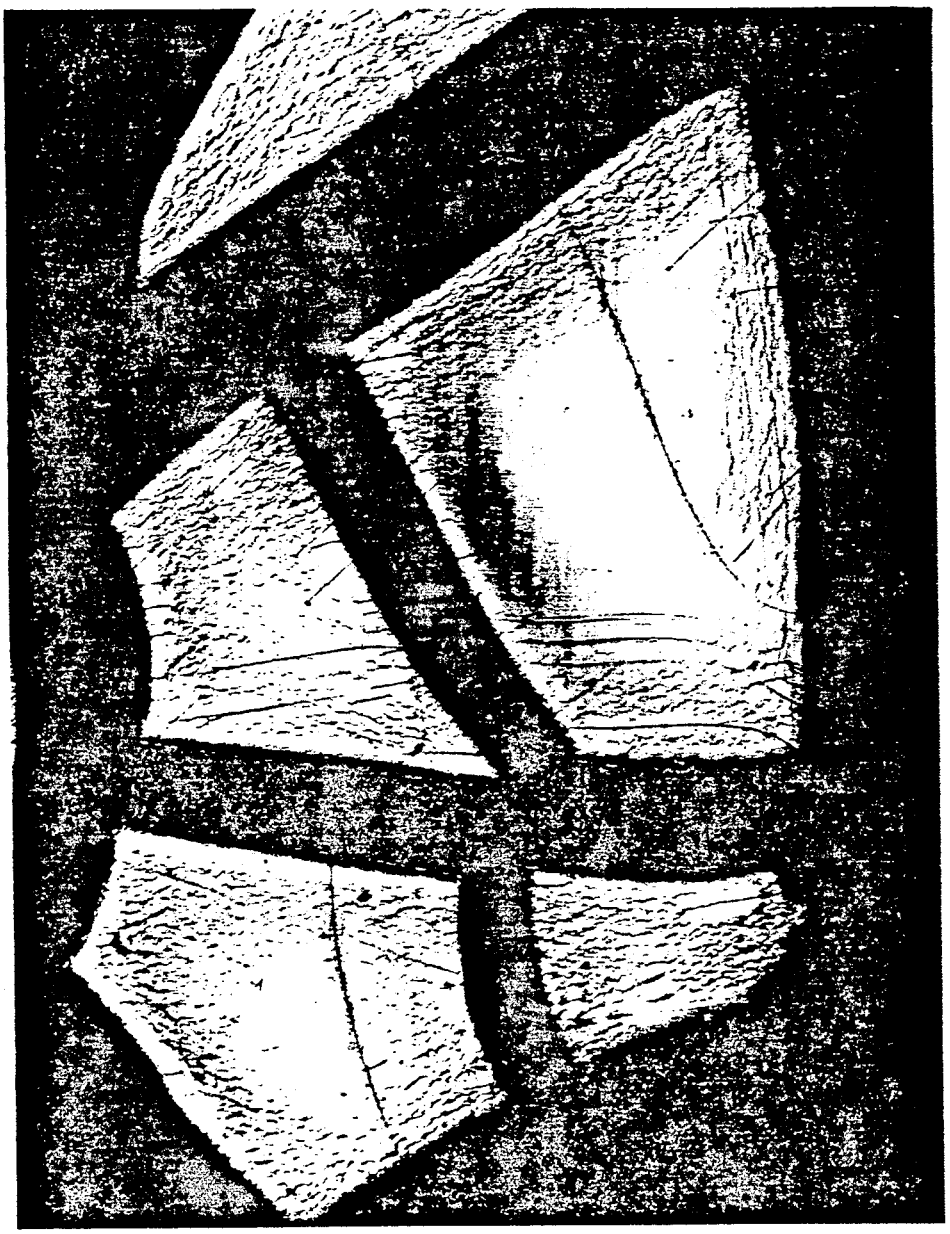
FIG. 9 is a 70× enlarged photograph of a metal coated, thermoformed sheet material not made by the method of the invention.

A repeat of the procedure described in Example 1, but omitting the pre-cracking step, led to a surface appearance as illustrated by the 70× photograph shown in FIG. 9. The pattern created in the metal layer was highly irregular and the surface did not have an attractive brushed metal appearance as did the thermoformed sheet material of the invention.

COMPARISON EXAMPLE 2

Example 1 was repeated except that aluminum was used instead of titanium. The 20-degree gloss was greatly in excess of 100 before pre-cracking. After pre-cracking and thermoforming, the surface of the same stretched portion as measured in Example 1 exhibited a gloss of 121.

The invention has been described in detail with particular reference to preferred embodiments thereof, but it will be understood that variations and modifications can be effected within the spirit and scope of the invention.

What is claimed is:

1. A method of forming a protective and decorative sheet material on a substrate which comprises:
   a. forming said sheet material by forming a continuous metal layer on a stretchable, theremoformable carrier film, said metal layer having a 20-degree gloss of at least 100;
   b. creating a plurality of substantially straight and parallel microscopic cracks in the metal layer at a temperature below the glass transition temperature of the carrier film without substantially changing the gloss of the metal layer, by bi-directionally bending and drawing the sheet material around a straight cracking member with the surface of the carrier film which is remote from the metal layer making contact with the cracking member; and, thereafter.
   c. stretching the sheet material at a temperature above the glass transition temperature of the carrier film, and bonding the sheet material to a substrate, said stretching enlarging the cracks in the metal layer to create a brushed metal appearance and reduce the 20-degree gloss of the metal layer to less than about 100.

2. The method of claim 1 wherein the sheet material is bonded to the substrate by thermoforming.

3. The method of claim 1 wherein, after creating said microscopic cracks in the metal layer, the sheet material is stretched at least bi-directionally at a temperature above the glass transition temperature of the carrier film.

4. The method of claim 1 wherein the metal layer is a titanium layer.

5. The method of claim 1 wherein the cracking member has a diameter of less than about 0.5 centimeters.

* * * * *